United States Patent
Lin et al.

(10) Patent No.: US 11,049,765 B2
(45) Date of Patent: Jun. 29, 2021

(54) SEMICONDUCTOR DEVICE

(71) Applicant: United Microelectronics Corp., Hsinchu (TW)

(72) Inventors: Da-Jun Lin, Kaohsiung (TW); Bin-Siang Tsai, Changhua County (TW); Chich-Neng Chang, Pingtung County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/866,360

(22) Filed: May 4, 2020

(65) Prior Publication Data
US 2020/0266095 A1    Aug. 20, 2020

Related U.S. Application Data

(62) Division of application No. 16/212,362, filed on Dec. 6, 2018, now Pat. No. 10,692,758.

(51) Int. Cl.
*H01L 23/522* (2006.01)
*H01L 23/528* (2006.01)
*H01L 21/768* (2006.01)
*H01L 23/532* (2006.01)

(52) U.S. Cl.
CPC .... *H01L 21/7682* (2013.01); *H01L 21/76834* (2013.01); *H01L 21/76877* (2013.01); *H01L 23/528* (2013.01); *H01L 23/5226* (2013.01); *H01L 23/5329* (2013.01); *H01L 2221/1047* (2013.01)

(58) Field of Classification Search
CPC ......... H01L 21/7682; H01L 2221/1042–1047; H01L 23/5222; H01L 23/53295
See application file for complete search history.

(56) References Cited

U.S. PATENT DOCUMENTS

| | | |
|---|---|---|
| 6,165,890 A | 12/2000 | Kohl |
| 6,403,852 B1 | 7/2002 | Grill |
| 6,693,355 B1 | 2/2004 | Grove |
| 2008/0185722 A1* | 8/2008 | Liu .................. H01L 21/76849 257/751 |

* cited by examiner

*Primary Examiner* — Daniel P Shook
(74) *Attorney, Agent, or Firm* — J.C. Patents

(57) ABSTRACT

A structure of semiconductor device includes a substrate, having a dielectric layer on top. The structure further includes at least two metal elements being adjacent, disposed in the dielectric layer, wherein an air gap is existing between the two metal elements. A porous dielectric layer is disposed over the substrate, sealing the air gap. An interlayer dielectric layer disposed on the porous dielectric layer.

10 Claims, 6 Drawing Sheets

SEMICONDUCTOR DEVICE

CROSS-REFERENCE TO RELATED APPLICATION

This application is a divisional application of and claims the priority benefit of U.S. application Ser. No. 16/212,362, filed on Dec. 6, 2018, now allowed. The entirety of the above-mentioned patent application is hereby incorporated by reference herein and made a part of this specification.

BACKGROUND

1. Field of the Invention

The present invention generally relates to semiconductor fabrication technology, and particularly to a structure of semiconductor device and method for fabricating the semiconductor device.

2. Description of Related Art

As integration of integrated circuit is significantly improved, the device size is accordingly reduced. Although the semiconductor structure can be stacked up at the vertical direction over the substrate, the area occupied the semiconductor device should be also reduced. As the device size is greatly reduced, a distance between the interconnect lines distributed at the horizontal direction is inevitably reduced as well.

As usually known, the interconnect lines are isolated by the inter-layer dielectric layer, such as oxide or nitride or the combination of multiple dielectric materials. Once the device size is reduced, the distance between the interconnect lines is then accordingly reduced. In this situation, a parasitic capacitance effect would occur between the interconnect lines and could influence the performance of the integrated circuit. As the parasitic capacitance is involved in the interconnect lines and the effect of RC constant in the integrated circuit gets large, resulting in reducing the circuit speed.

How to properly reduce the parasitic capacitance effect between adjacent interconnect elements is an issue as concerned in design.

SUMMARY OF THE INVENTION

The invention provides a structure of semiconductor device and a method for fabricating the semiconductor device, in which an air gap is formed between adjacent two of metal elements. While the dielectric layer for sealing over the air gap would not enter to the bottom of the air gap. The volume of the air gap may remain large without consumed by the deposited dielectric layer over the air gap. The parasitic capacitance between the metal elements may be effectively reduced.

In an embodiment, the invention provides a structure of semiconductor device, comprising: a substrate, having a dielectric layer on top. The structure further comprises at least two metal elements being adjacent, disposed in the dielectric layer, wherein an air gap is existing between the two metal elements. A porous dielectric layer is disposed over the substrate, sealing the air gap. An inter-layer dielectric layer disposed on the porous dielectric layer.

In an embodiment, as to the structure of semiconductor device, the porous dielectric layer is an ultra-low-dielectric-constant (ULK) layer.

In an embodiment, as to the structure of semiconductor device, the ULK layer is a cured layer.

In an embodiment, as to the structure of semiconductor device, a thickness of the porous dielectric layer is in a range of 35-65 angstroms.

In an embodiment, as to the structure of semiconductor device, the structure further comprises a cap layer conformally disposed over the two metal elements and the air gap.

In an embodiment, as to the structure of semiconductor device, the porous dielectric layer and the inter-layer dielectric layer do not enter the air gap.

In an embodiment, as to the structure of semiconductor device, the inter-layer dielectric layer is thicker than the porous dielectric layer.

In an embodiment, as to the structure of semiconductor device, the inter-layer dielectric layer is at least 10 times of the thickness of the porous dielectric layer.

In an embodiment, as to the structure of semiconductor device, each of the two metal elements comprises metal plug or metal line.

In an embodiment, as to the structure of semiconductor device, the structure further comprises an etching stop layer between the substrate and the cap layer other than the air gap.

In an embodiment, the invention also provides a method for fabrication semiconductor device. The method comprises providing a substrate, having a dielectric layer on top. The method further comprises forming at least two metal elements being adjacent in the dielectric layer and removing a portion of the dielectric layer between the two metal elements to form an air gap. A thermal decomposition layer is filled into the air gap. A porous dielectric layer is disposed over the substrate with covering on the thermal decomposition layer. A thermal treatment is performed to remove the thermal decomposition layer through the porous dielectric layer. An inter-layer dielectric layer is formed on the porous dielectric layer.

In an embodiment, as to the method for fabrication semiconductor device, the porous dielectric layer is an ultra-low-dielectric-constant (ULK) layer.

In an embodiment, as to the method for fabrication semiconductor device, the method further performing an ultra-violet curing process on the ULK layer.

In an embodiment, as to the method for fabrication semiconductor device, a thickness of the porous dielectric layer is in a range of 35-65 angstroms.

In an embodiment, as to the method for fabrication semiconductor device, the method further comprises forming a cap layer conformally disposed over the two metal elements and the air gap.

In an embodiment, as to the method for fabrication semiconductor device, the porous dielectric layer and the inter-layer dielectric layer do not enter the air gap.

In an embodiment, as to the method for fabrication semiconductor device, the inter-layer dielectric layer is thicker than the porous dielectric layer.

In an embodiment, as to the method for fabrication semiconductor device, the inter-layer dielectric layer is at least 10 times of the thickness of the porous dielectric layer.

In an embodiment, as to the method for fabrication semiconductor device, each of the two metal elements comprises metal plug or metal line.

In an embodiment, as to the method for fabrication semiconductor device, further comprising an etching stop layer between the substrate and the cap layer other than the air gap.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the fabrication technology of semiconductor device. To at least reduce the parasitic capacitance effect between metal elements, such as interconnect elements, the invention takes a strategy to form an air gap between adjacent two metal elements as intended, in which the metal elements are part of the interconnect structure and may include metal lines or metal plugs.

Multiple embodiments are provided for descriptions of the invention. However, the invention is not limited to the embodiments.

Figure 1:
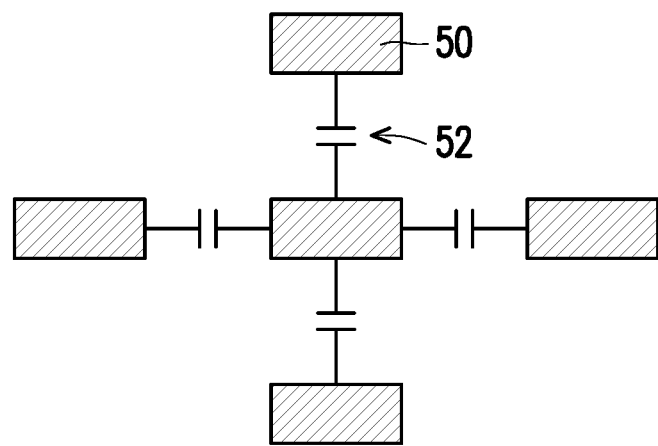
FIG. 1 is a drawing, schematically illustrating the method for fabricating an interconnect structure of semiconductor device as looked into, according to an embodiment of the invention.

The invention has looked into the issue of parasitic capacitance effect between the interconnect lines or nodes. FIG. 1 is a drawing, schematically illustrating a layout of interconnect lines with the parasitic capacitors, according to an embodiment of the invention.

Referring to FIG. 1 interconnect elements 50 are distributed as a metal layer. The interconnect elements 50 are isolated by dielectric material, formed as inter-layer dielectric layer. As previously mentioned, when the device sized is reduced, the distance between the interconnect lines 50 would be reduced, accordingly. As known, a parasitic capacitor 52 is more obviously existing between the interconnect lines 50. The parasitic capacitance is proportional to k/d, wherein k is the dielectric constant of the dielectric material and d is the distance between the interconnect lines. The parameter d gets small when the size is reduced.

In the situation of reducing the distance d, the capacitance may be reduced by reducing the dielectric constant k. Air has the dielectric constant k about equal to 1. An air gap is then expected to be formed between metal elements, so to reduce the capacitance between metal elements.

Figure 2:
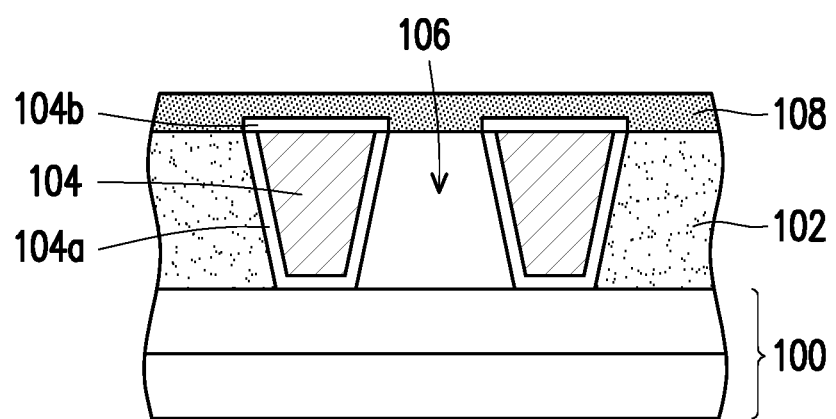
FIG. 2 is a drawing, schematically illustrating the method for fabricating an interconnect structure of semiconductor device as looked into, according to an embodiment of the invention.

FIG. 2 is a drawing, schematically illustrating the method for fabricating an interconnect structure of semiconductor device as looked into, according to an embodiment of the invention.

Referring to FIG. 2, the concept to involve the air gap to reduce the capacitance is following. A substrate in fabrication may generally include a substrate base 100 and a dielectric layer 102 on the substrate base 100. In other word, the dielectric layer 102 is a part of the substrate on top. The substrate base 100 may further includes a silicon substrate and other device layer to serve the substrate at the current fabrication level. Further, multiple metal elements 104 are formed in the dielectric layer 102. Here, the metal elements 104 may include metal plugs, metal lines, or a mix of them without specific limitation, in which the cross-section structures for the metal elements are similar.

The metal elements, such as copper elements, are usually formed by plating process. To have better quality to plating the metal as the metal element 104, a seed layer 104a may be formed first on the sidewall and the bottom of the trench or opening. The seed layer 104a may further comprises a barrier layer. In addition, a cobalt layer 104b may also be formed on the metal elements 104 to improve conductivity. However, the method to form the metal elements is not just limited by the embodiments.

To reduce the capacitance between the metal elements 104, the dielectric material between adjacent metal elements 104 is removed to have an air gap 106. An etching stop layer 108 or other dielectric layer may cover over the dielectric layer 102 to seal the air gap 106. As a result, the air gap 106 exists between the adjacent two of the metal elements 104. The capacitance between the metal elements 104 is then reduced.

To form the air gap between adjacent two metal elements, the invention has proposed a fabrication method to form the air gap, in which the subsequent dielectric material during deposition may not enter the air gap, such as at a bottom of the air gap. As a result, the volume of the air gap can remain large, to reduce the average dielectric constant, and then reduce the parasitic capacitance.

FIGS. 3A-3I are a drawing, schematically illustrating the method for fabricating semiconductor device, according to an embodiment of the invention.

Figure 3A:
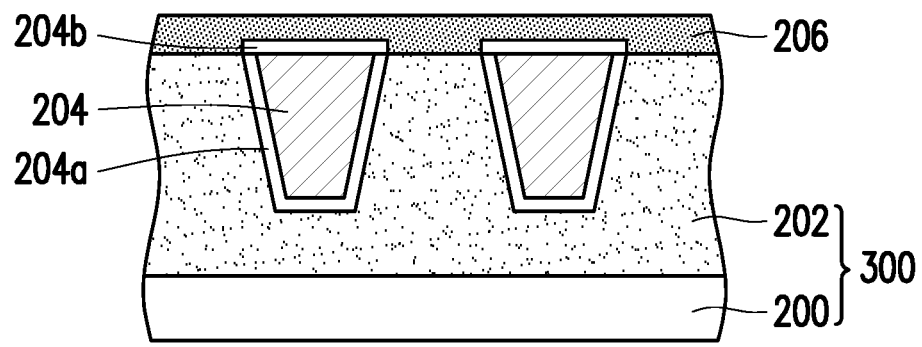
FIGS. 3A-3I are a drawing, schematically illustrating the method for fabricating semiconductor device, according to an embodiment of the invention.

Referring to FIG. 3A, a substrate 300 is provided. The substrate 300 includes a substrate base 200 and a dielectric layer 202 on top, in an embodiment. As also stated in FIG. 2, in an embodiment, the dielectric layer 202 may further include an etching stop layer 206 as a part of the dielectric layer 202. The substrate base 200 may include a silicon substrate and the device layer, stacking up.

Multiple metal elements 204 are formed in the dielectric layer 202. An etching stop layer 206 of dielectric material, such as nitride, is further formed over the dielectric layer 202. The formation of the etching stop layer 206 is depending on the actual need. Actually, ion the other hand, the etching stop layer 206 can be a part of the dielectric layer 202 without specific limitation. As also previously stated, the metal elements 204 comprises plug or metal line. To perform plating process for the metal elements 204, the seed layer 204a may be included. Further, to reduce the resistance of the metal elements 204 in electric contact, a cobalt lay 204b may be also included.

Figure 3B:
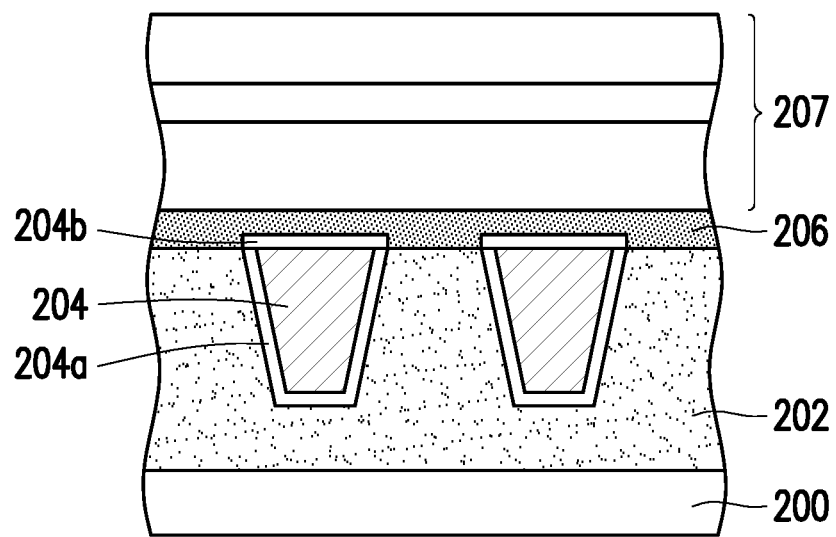
Figure 3C:
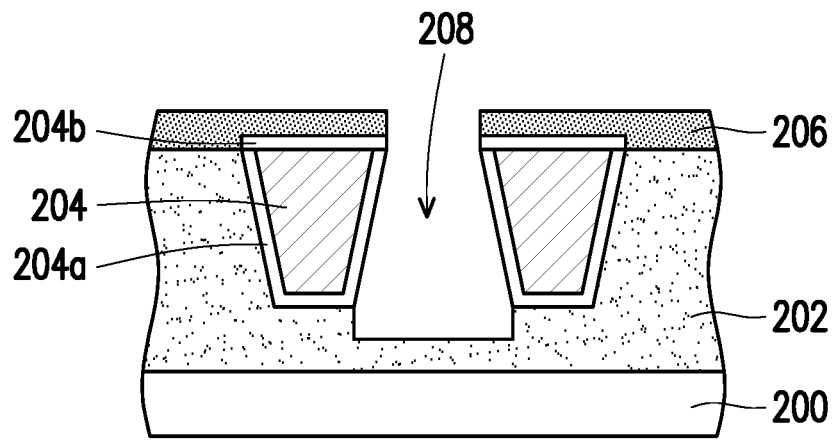

Referring to FIG. 3B, a photoresist layer 207 is formed on the etching stop layer 206. The photoresist layer 207 can be single layer or multiple layers as stacked, such as triple layers. Referring to FIG. 3C, by use of the photoresist layer 207 in photolithographic and etching process, the dielectric layer 202 with the etching stop layer 206 are patterned to have an air gap 208 between adjacent two of the metal elements.

Figure 3D:
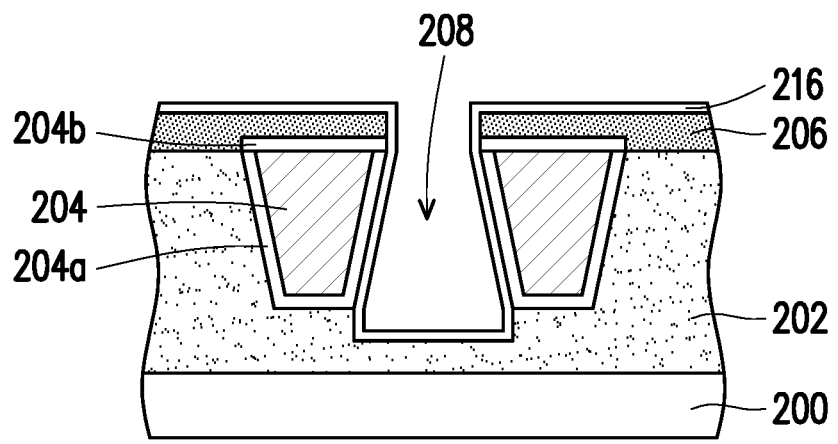

Referring to FIG. 3D, a cap layer 216 is formed conformally over the substrate 200. As a result, the sidewall and the bottom of the air gap 208 is formed to insulate the metal elements 204. The material of the cap layer 216 in an embodiment may include nitrogen-doped SiC (NDC), aluminum nitride, oxygen-doped SiC (ODC), or silicon oxide. The thickness of the cap layer 216 may be 60 angstroms or less, in an embodiment.

Figure 3E:
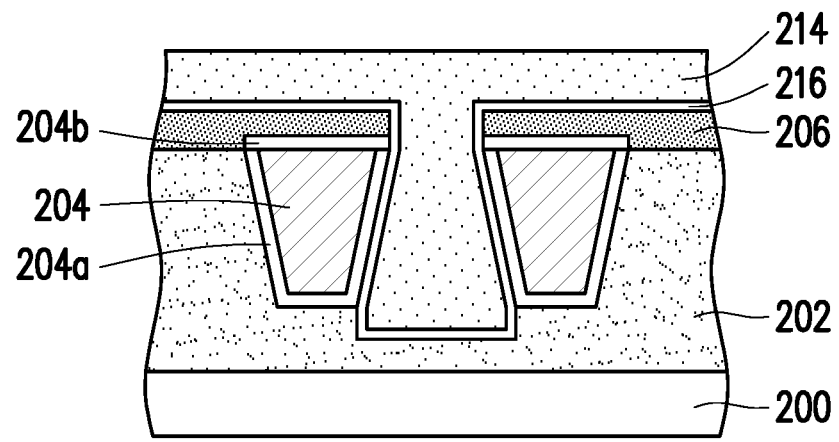
Figure 3F:
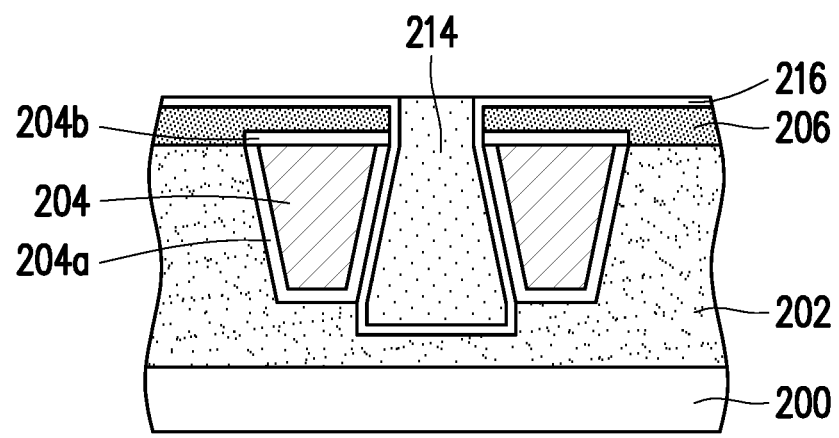

Referring to FIG. 3E, in an embodiment, a thermal decomposition layer 214 is disposed over the substrate 200 to at least fill the air gap 208. Referring to FIG. 3F, a polishing process, such as chemical mechanical polishing (CMP) process, is performed to remove the portion of the thermal decomposition layer 214 above the cap layer 216. Here, as previously, the etching stop layer 206 and the cap layer 216 are option, depending on the actual need. The features here is that the thermal decomposition layer 214 fills the air gap 208 seen in FIG. 3D and the polishing process planarize the top surface.

Figure 3G:
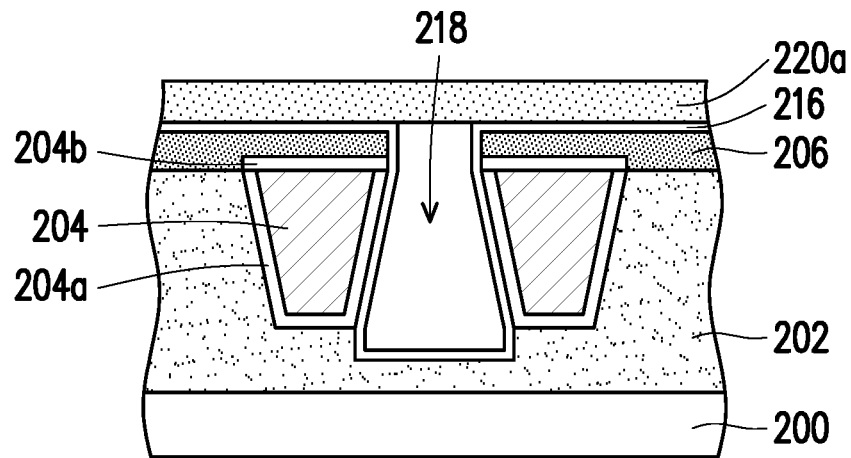

Referring to FIG. 3G, a porous dielectric layer 220a is disposed over the substrate base 200. A thickness of the porous dielectric layer 220a is in a range of 35-65 angstroms, in an embodiment. The porous dielectric layer 220a, on the other hand, may be an ultra-low-dielectric-constant (ULK) layer. The porous structure allows material in gas-like state to leak away. In this embodiment, a thermal treatment process may be performed on the thermal decomposition layer 214, which is then decomposed into gas-like state and then leaks through the porous dielectric layer 220a.

As a result, the air gap 218 is formed and sealed by the porous dielectric layer 220a. It can be noted that the volume of the air gap 218 has been optimized. Deposition of the porous dielectric layer 220a and the subsequent dielectric layer 220b (seen in FIG. 3H) may not enter the air gap 218, in the invention. The volume of air gap 218 may be optimized without being significantly reduced.

Figure 3H:
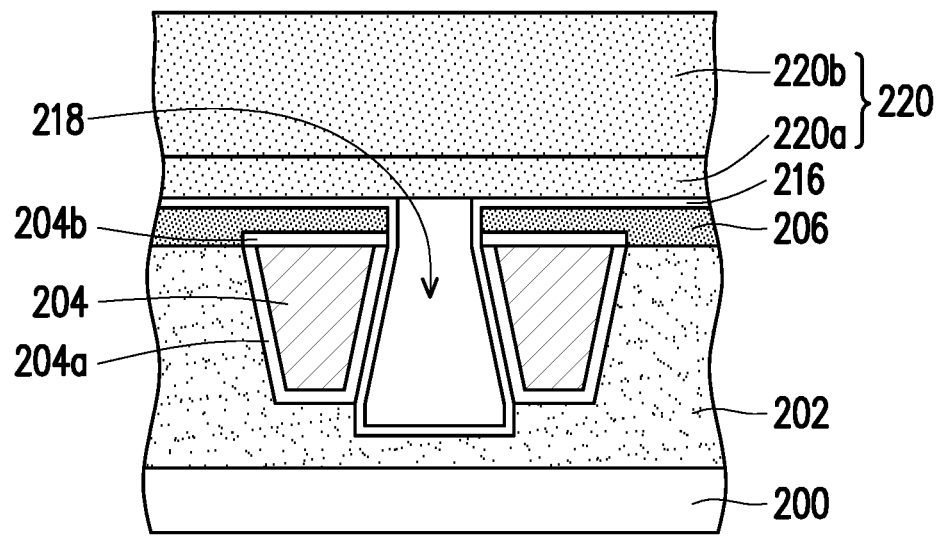

Referring to FIG. 3H, an inter-layer dielectric layer 220b may be formed on the porous dielectric layer 220a. The inter-layer dielectric layer 220b and the porous dielectric layer 220a may be combined together as a general inter-layer dielectric layer 220, the invention is not limited thereon. Here, material of the inter-layer dielectric layer 220b may be also the porous dielectric material or other dielectric layer without specific limitation.

Figure 3I:
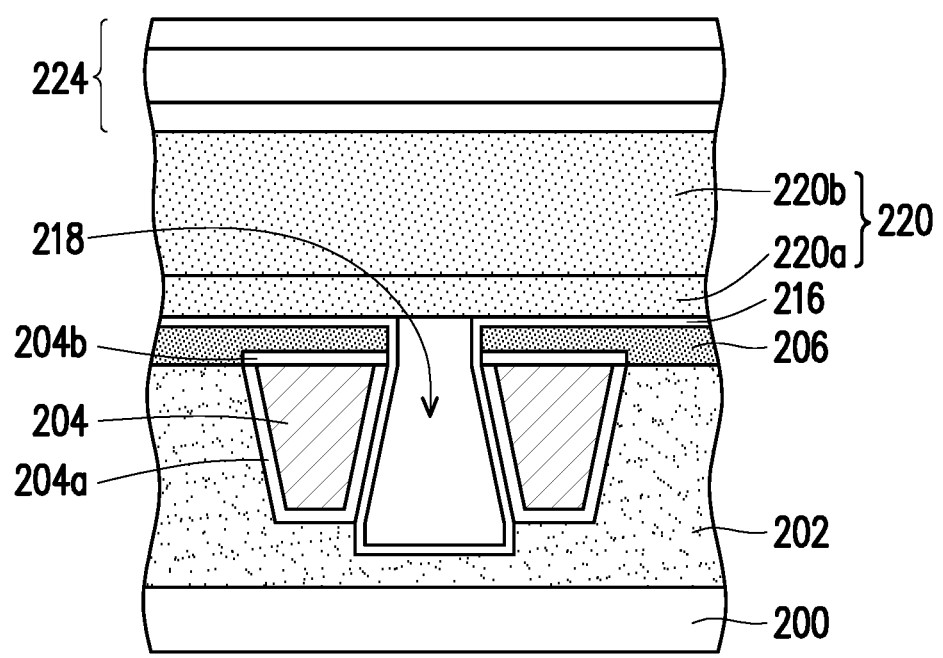

Referring to FIG. 3I, even further other stack layer 224 may be formed on the inter-layer dielectric layer 220b, depending on the actual need to form the intended structure as designed.

In the invention, the volume of the air gap 218 may be improved without being consumed while depositing the porous dielectric layer 220a and the inter-layer dielectric layer 220b. The parasitic capacitance between the metal elements 204 is then reduced. The RC constant is thereby reduced. The invention provides the method to form the structure with the air gap 218, in which the thermal decomposition layer 214, porous dielectric layer 220a and the thermal treatment process are involved to form the air gap 218.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of semiconductor device, comprising:
   a substrate, having a dielectric layer on top;
   at least two metal elements being adjacent, disposed in the dielectric layer, wherein an air gap is existing between the two metal elements; and
   a porous dielectric layer, disposed over the substrate, sealing the air gap; and
   an inter-layer dielectric layer disposed on the porous dielectric layer.

2. The structure as recited in claim 1, wherein the porous dielectric layer is an ultra-low-dielectric-constant (ULK) layer.

3. The structure as recited in claim 2, wherein the ULK layer is a cured layer.

4. The structure as recited in claim 1, wherein a thickness of the porous dielectric layer is in a range of 35-65 angstroms.

5. The structure as recited in claim 1, further comprising a cap layer conformally disposed over the two metal elements and the air gap.

6. The structure as recited in claim 1, wherein the porous dielectric layer and the inter-layer dielectric layer do not enter the air gap.

7. The structure as recited in claim 1, wherein the inter-layer dielectric layer is thicker than the porous dielectric layer.

8. The structure as recited in claim 1, wherein the inter-layer dielectric layer is at least 10 times of the thickness of the porous dielectric layer.

9. The structure as recited in claim 1, wherein each of the two metal elements comprises metal plug or metal line.

10. The structure as recited in claim 1, further comprising an etching stop layer between the substrate and the cap layer other than the air gap.

* * * * *